US006772612B2

(12) United States Patent  
Carson

(10) Patent No.: US 6,772,612 B2  
(45) Date of Patent: Aug. 10, 2004

(54) DOOR-IN-DOOR FRONT OPENING UNIFIED POD

(75) Inventor: Steven L. Carson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 10/060,864

(22) Filed: Jan. 29, 2002

(65) Prior Publication Data

US 2003/0140663 A1 Jul. 31, 2003

(51) Int. Cl.[7] .......................... B65D 55/14; E05B 65/52
(52) U.S. Cl. .............................. 70/63; 312/292; 70/82; 70/158
(58) Field of Search ................................ 70/63, 69, 78, 70/82, 158, 159–173; 312/292, 291; 206/710–712, 832, 833

(56) References Cited

U.S. PATENT DOCUMENTS

| | | | | | |
|---|---|---|---|---|---|
| 2,281,430 A | * | 4/1942 | Grant | ......................... | 312/292 |
| 4,087,140 A | * | 5/1978 | Linstromberg | .............. | 312/292 |
| 4,132,440 A | * | 1/1979 | Johnson | ................. | 292/341.19 |
| 4,503,584 A | * | 3/1985 | Malchow | ...................... | 16/232 |
| 4,536,990 A | * | 8/1985 | Siegrist et al. | ................ | 49/501 |
| 4,620,344 A | * | 11/1986 | Lewis, Jr. | ..................... | 16/337 |
| 4,704,882 A | * | 11/1987 | Takasaki | ...................... | 70/215 |
| 6,071,059 A | | 6/2000 | Mages et al. | | |
| 6,098,809 A | * | 8/2000 | Okada et al. | ............... | 206/711 |
| 6,296,337 B1 | * | 10/2001 | Kawanabe | ............... | 312/319.2 |
| 6,354,119 B1 | * | 3/2002 | Molzer | ........................ | 70/210 |
| 6,457,598 B1 | * | 10/2002 | Hsieh et al. | ................ | 220/323 |

OTHER PUBLICATIONS

Jenkins et al., "in the 300 mm Environment" Semiconductor International Test Automation, Aglient Technologies, Palo Alto, CA, Jun. 2001.

Gallagher et al., "Addressing the 300–mm challenge with new wafer–carrier architecture" Micro Magazine.com, http://www.micromagazine.com, p. 81, Jul. 1999.

Chappell "Brooks promises FOUP IP for all " Semiconductor International, www.semiconductor.net, San Francisco, CA, Jul. 13, 2000.

News Release—Entegris Debuts Industry's First 300 MM Reduced–Pitch Front–Opening Shipping System FabFit™ 300 is 40 percent smaller than standard–pitch systems, http://www.mcapr.com.

Ottesen "Front Opening Unified Pod (FOUP) Fire Protection: A General Overview" International Sematech Technology Transfer, 2706 Montopolis Drive, Austin, TX 78741, 1999.

"Major North American IC Manufacture orders Entegris Cleaning System", http://www.empak.com. Oct. 11, 2000.

"High–Tech public Relations: Industry Leaders", www.m-capr.com. Oct. 11, 2000.

"Specific Solutions for handling of Masks and Wafers within Semiconductor Manufacturing" Dresdner Transfer Brief, http://www.tu–drwsden.de/vd51/trabrief/022000/s18.htm, Feb. 2000.

(List continued on next page.)

Primary Examiner—John B. Walsh
(74) Attorney, Agent, or Firm—Fish & Richardson P.C.

(57) ABSTRACT

An apparatus for holding a substrate includes a shelf capable of holding the substrate; a body which encloses the shelf, the body having an open side; and an outer door frame pivotally coupled to the body and defining an opening. The apparatus also includes an inner door which fits into the opening. The body's open side is substantially covered by the inner door and by the outer door frame when the inner door and outer door frame are in closed positions. The apparatus can include a double hinge for pivotally coupling the outer door frame to the body. It can also include a bolt that is movably attached to the inner door, so that the inner door has a locked position in which the bolt extends into the frame and an unlocked position in which the bolt retracts from the frame.

15 Claims, 8 Drawing Sheets

OTHER PUBLICATIONS

Fixload™ 300mm Standard Load Port for FOUPs (Front Opening Unified Pod) Bolts Compatible Interface, http://www.fastech.com/producets/FBU/fixload, Oct. 11, 2000.

Atmospheric Factory Interfaces Foup LPM Load Port Module/Door Opener for 300mmm FOUPs Automated or Manual Loading, http://www.brooks.com/poducts/ABU/factory‾interfaces/flpml.htm, Oct. 11, 2000.

Brooks Automation Receives Additional Patent on Its FOUP–Opener Technology, http//:www.fatech.org/industry.news/0006/160.1, shtml, Oct. 11, 2000.

"300mm Pod Door Opener Opens the FOUP, indexes it, and uses non–reflective technology to scan wafers!" http://www.kensingtonlabs.com/products/300door/, Oct. 11, 2000.

* cited by examiner

DOOR-IN-DOOR FRONT OPENING UNIFIED POD

TECHNICAL FIELD

This invention relates to apparatus for transport and storage of semiconductor substrates.

BACKGROUND

A front opening unified pod (FOUP) is a container for transporting and storing semiconductor substrates. A FOUP combines a cassette and a boat box for holding cassettes. It has shelves for holding substrates, an outer box-shaped pod body having five sides, and a door for sealing the pod body's sixth side. The frame is slightly larger, both in terms of width and length, than the pod body. The door is bolted into the frame, and the frame is fused to the pod body. The pod body, shelves, and door are made of plastic. Typically, to open the door, keys need to be inserted into a lock assembly in the door.

In use, a single FOUP is placed in a loading station of a semiconductor processing tool, flush against a tool door having two keys. The tool door, attached to an arm, opens the FOUP door by turning the keys in the FOUP door, thus opening bolts that attach the FOUP door to the FOUP body. The tool door pulls on the FOUP door with a vacuum, pulls the FOUP door away from the FOUP pod body, and lowers the FOUP door, thereby exposing wafers inside the FOUP. After a wafer is removed from the FOUP for processing and is processed, the wafer is returned to the FOUP.

The FOUP door cannot be opened without a tool door, unless one has two keys manufactured, inserts the keys into the FOUP door by hand, turns the keys simultaneously, and pulls the door off. This option is undesirable because opening the FOUP door outside a FOUP station can expose the wafers inside the FOUP to a relatively unclean environment.

The door of a FOUP is generally opened in ultra-clean system environments, e.g. Class 1, to avoid contaminating wafers inside the FOUP. Sometimes, however, wafers may be exposed to less clean environments. For example, during a lithography process, a wafer may be removed from a FOUP in a Class 1 environment and fed by a track to a scanner. The wafer is processed and returned to the FOUP pod via the track. If, however, the wafer is rejected by the scanner, it is not returned to the FOUP. Instead, it is transferred to an open wafer cassette, e.g., a Crystalpak®, with other rejected wafers. A Crystalpak®, manufactured by Entegris, Inc., is a plastic cassette in which wafers are shipped by a wafer manufacturer. A Crystalpak® has 13 slots for holding 13 300 mm wafers and has a height of 18 centimeters (cm). On the other hand, a FOUP currently used in industry has 25 slots for holding 25 300 mm wafers and is twice the height of a Crystalpak®, e.g., 36 cm. A Crystalpak® can be placed inside a scanner, and rejected wafers can be moved into the Crystalpak®. The scanner's loading arm is stationery and the wafer carrier moves during loading and unloading. The configuration does not provide sufficient range of motion for loading and unloading wafers to/from a FOUP, but it is sufficient for, e.g., a Crystalpak®. The wafer cassette is then removed from the scanner, and the wafers in the boat are transferred to another FOUP. The wafers in the wafer boat are thus exposed to a less clean atmosphere than that of the processing equipment, such as Class 10 instead of Class 1. This exposure can contaminate the wafers, increasing defect densities. The wafers in the system environment cannot be placed directly into a second FOUP if the system has only one port for a FOUP. Further, a FOUP cannot be placed inside the processing tool because of constraints imposed by the method of opening the front door, such as the requirement that a tool door be used for opening the FOUP door. Finally, a FOUP may not physically fit inside a tool, even in the FOUP's closed position.

DESCRIPTION

A FOUP is described, having thirteen slots for holding thirteen wafers. Its door configuration enables it to be placed inside a processing tool and opened by a currently available FOUP handler, as well as to be opened and closed without a FOUP handler.

Figure 1A:
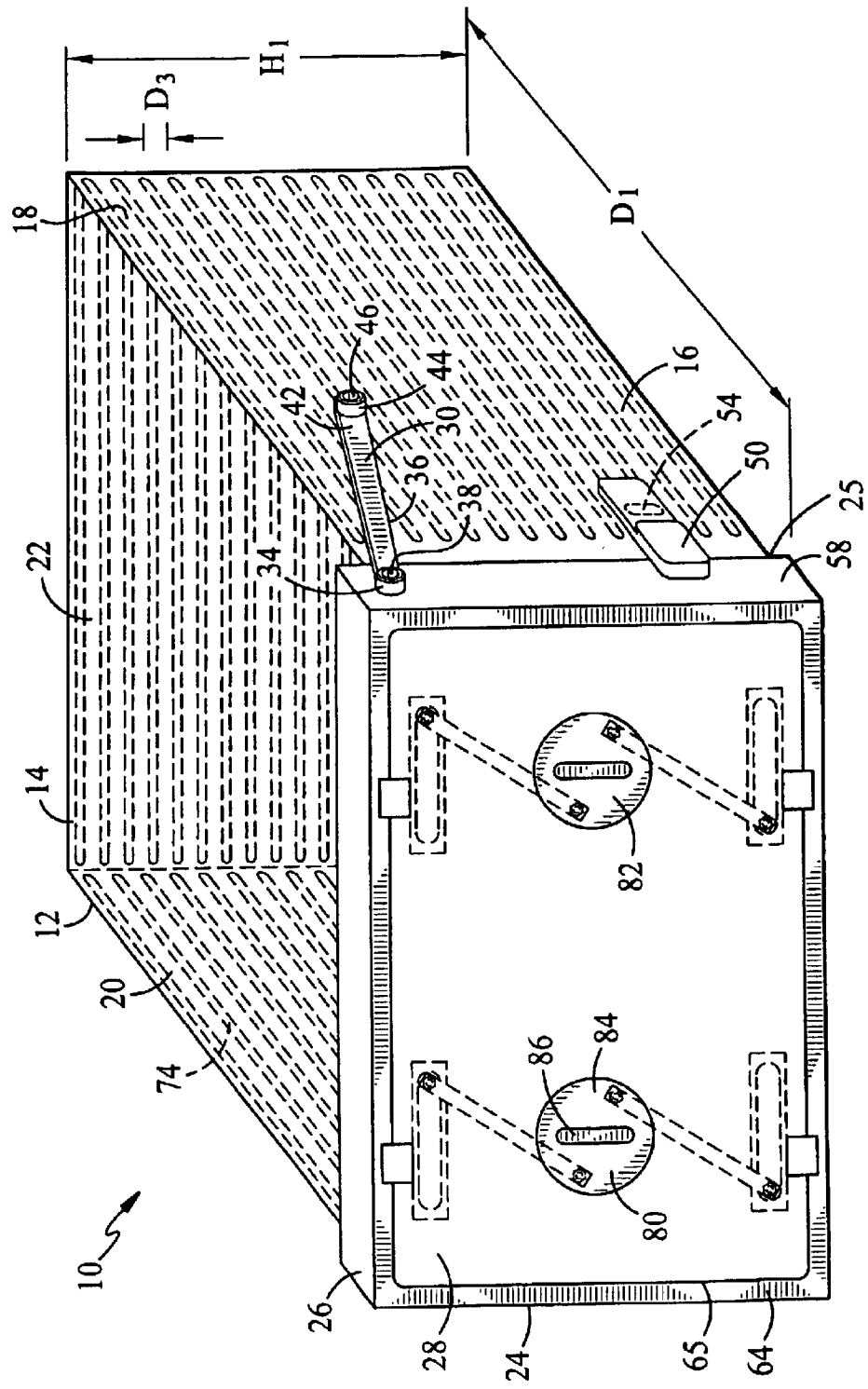
FIGS. 1A–1B are schematic drawings of a door-in-door front opening unified pod.
Figure 1B:
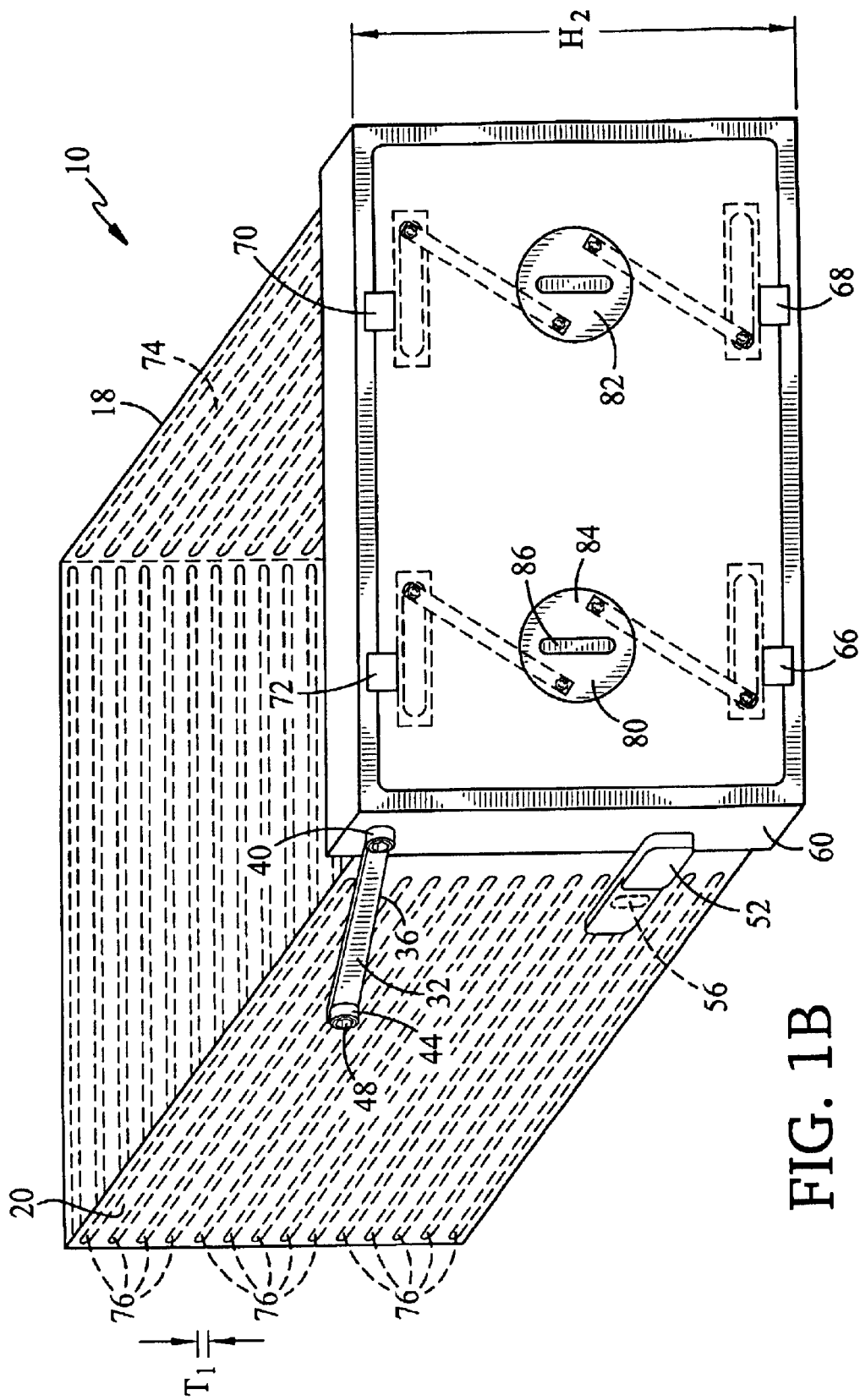

Referring to FIGS. 1A–1B, a door-in-door front opening unified pod 10, hereinafter referred to as "DIDFOUP," has a cube-shaped pod body 12. Pod body 12 has a top side 14, a bottom side 16, first and second lateral sides 18, 20, and a back side 22. A door-in-door 24 is sized to close a front side 25 of pod body 12. Door-in-door 24 has a frame 26 and an inner door 28.

Frame 26 is movably attached to first and second lateral sides 18, 20 by first and second double hinges 30, 32, respectively. First ends 34, 36 of double hinges 30, 32 are pivotally secured to frame 26 by hinge bolts 38, 40, respectively. Second ends 42, 44 of double hinges 30, 32 are pivotally secured to first and second lateral sides 18, 20, respectively, by hinge bolts 46, 48. In its closed position, frame 26 is further secured against pod front side 25 by first and second latches 50, 52. First and second latches 50, 52 are attached to first and second sides 58, 60 of frame 26. First and second latch receptacles 54, 56 are located on first and second lateral sides 18, 20 of pod body 12. When frame 26 is positioned against pod front side 25, first and second latches 50, 52 can be manipulated to close by hooking onto latch receptacles 54, 56. First and second latches 50, 52 can thus to prevent accidental opening of frame 26.

Inner door 28 is sized to fit in an opening 64 defined by an inner perimeter 65 of frame 26. In its closed position, inner door 28 is secured by four bolts 66, 68, 70, 72 protruding into frame 26.

Pod body 12 contains a wafer support structure 74 having a plurality of shelves 76 (represented by dotted lines in FIGS. 1A and 1B), for example, thirteen shelves 76. Each shelf 76 is sized to hold a semiconductor wafer (not shown), such as a round silicon wafer having a diameter of 300 mm. Each shelf 76 is a horizontal ridge extending along first and second lateral sides 18, 20 and back side 22. Each shelf 76 is formed by, e.g., injection molding as an integral part of first and second lateral sides 18, 20 and back side 22.

Pod body 12 has a height $H_1$ of, e.g., 18 centimeters (cm) and a depth $D_1$ of, e.g., 32 cm. Frame 26 has a height $H_2$ of, e.g., 21 cm.

Each of the plurality of shelves 76 has a thickness $T_1$ of, e.g., 0.3 cm. Each one of the plurality of shelves 76 is a distance $D_3$, e.g., 0.4 cm from a proximate shelf 76. Shelves 76, therefore, have a pitch of 0.7 cm, equal to the sum of $T_1$ and $D_3$.

Pod body 12 and each of the plurality of shelves 76 are made of a plastic material.

Figure 2:
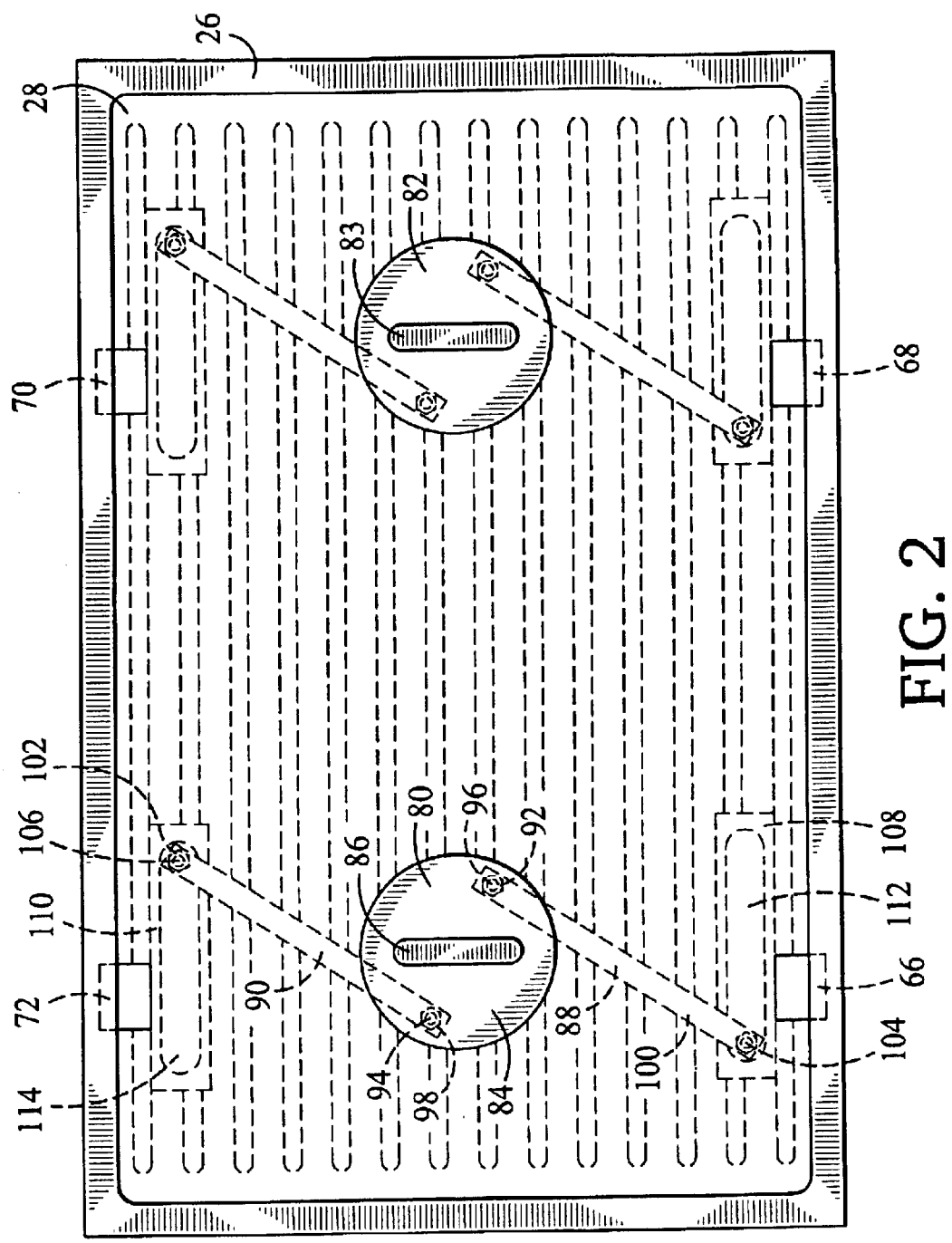
FIG. 2 is a frontal view of a door-in-door in a locked position.

Referring also to FIG. 2, inner door 28 has first and second keyed locking mechanisms 80, 82. Here, first and second locking mechanisms 80, 82 are shown in a locked position in which bolts 66, 68, 70, 72 extend into frame 26. First and second keyed locking mechanisms 80, 82 have similar structures. To avoid redundancy, only first locking mechanism 80 will be described in detail, with the implication that second keyed locking mechanism has an analogous construction. First keyed locking mechanism 80 has a plate 84 defining a keyhole 86. Plate 84 and keyhole 86 are located on an external side of inner door 28. First and second locking rods 88, 90 are positioned within inner door 28 and are encased by inner door 28. First and second locking rods 88, 90 are pivotally attached at their respective first ends 92, 94 to plate 84 by first and second rod bolts 96, 98. Respective second ends 100, 102 of first and second locking rods 88, 90 are slidably attached by first and second roller bolts 104, 106 to first and second cams 108, 110. First and second cams 108, 110 define first and second grooves 112, 114 to which first and second roller bolts 104, 106 are slidably coupled. First keyed locking mechanism 80 controls positioning of two bolts 66, 72 by controlling the positioning of first and second cams 108, 110 to which two bolts 66, 72 are attached. As shown (FIG. 2), when first keyed locking mechanism 80 is in a locked position, bolts 66, 72 extend into frame 26. Bolts 66, 72, along with bolts 68, 70 that are similarly configured in second keyed locking mechanism 82, thus secure inner door 28 within frame 26.

Figure 3:
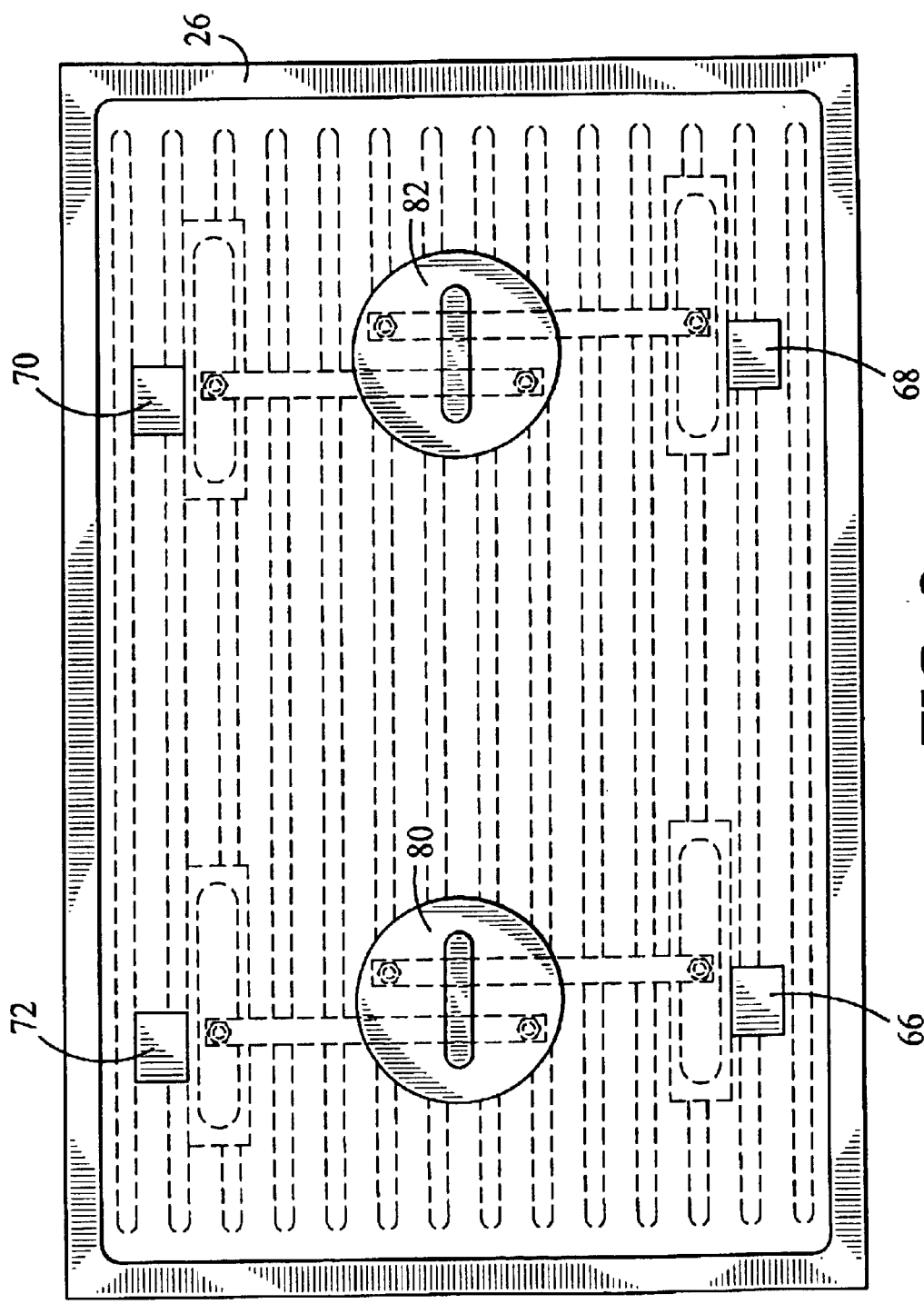
FIG. 3 is a frontal view of a door-in-door in an unlocked position.

Referring also to FIG. 3, first keyed locking mechanism 80 is moved to an unlocked position when a key (not shown) is inserted into keyhole 86 and the key is turned counterclockwise. Turning the key also rotates plate 84 counterclockwise, thus moving first keyed locking mechanism 80 from a locked position to an unlocked position. When plate 84 rotates counterclockwise, it moves first and second locking rods 88, 90 as follows. First end 92 of first locking rod 88 moves upwardly counterclockwise, rotating about first rod bolt 96. At the same time, second end 100 of first locking rod 88 also moves upwardly counterclockwise, with first roller bolt 104 sliding along groove 112. While moving upwards, second end 100 also moves cam 108 upwards and lifts bolt 66 out of frame 26. Meanwhile, first end 94 of second locking rod 90 moves downwardly counterclockwise, rotating about second rod bolt 98. At about the same time, second end 102 of second locking rod 90 moves downwardly counterclockwise, with second roller bolt 106 sliding along groove 114. While moving downward, second end 102 also moves cam 110 downwards and retracts bolt 72 down from frame 26.

Second keyed locking mechanism 82 is similarly moved to an unlocked position. When both first and second keyed locking mechanisms 80, 82 are in their respective unlocked positions, bolts 66, 68, 70, and 72 are withdrawn from frame 26. Inner door 28 is then free to be removed from frame 26 by, e.g., a tool door (not shown).

Figure 4:
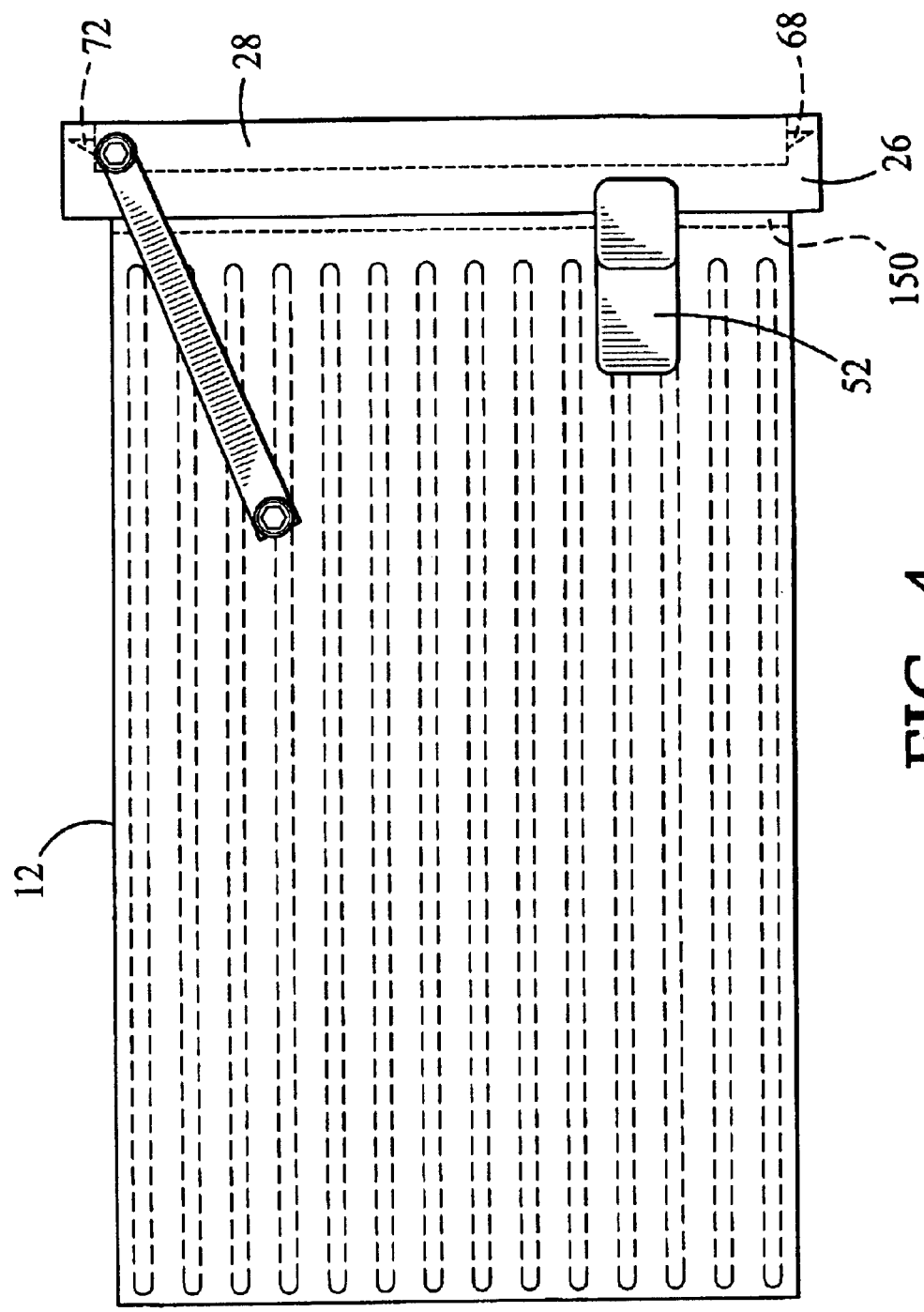
FIGS. 4–7 are cross-sectional views of a door-in-door front opening unified pod illustrating some embodiments, with the door in various positions.

Referring to FIG. 4, in its fully closed position, inner door 28 is locked in frame 26 (FIG. 2), and frame 26 is closed flush with front side 25 of pod body 12. Latch 52 secures frame 26 against front side 25 and prevents frame 26 from opening. An o-ring 150 is fitted into front side 25 to ensure a tight seal between pod body 12 and frame 26, thus preventing contaminants from entering pod body 12. Bolts 68, 72 secure inner door 28 in frame 26.

Figure 5:
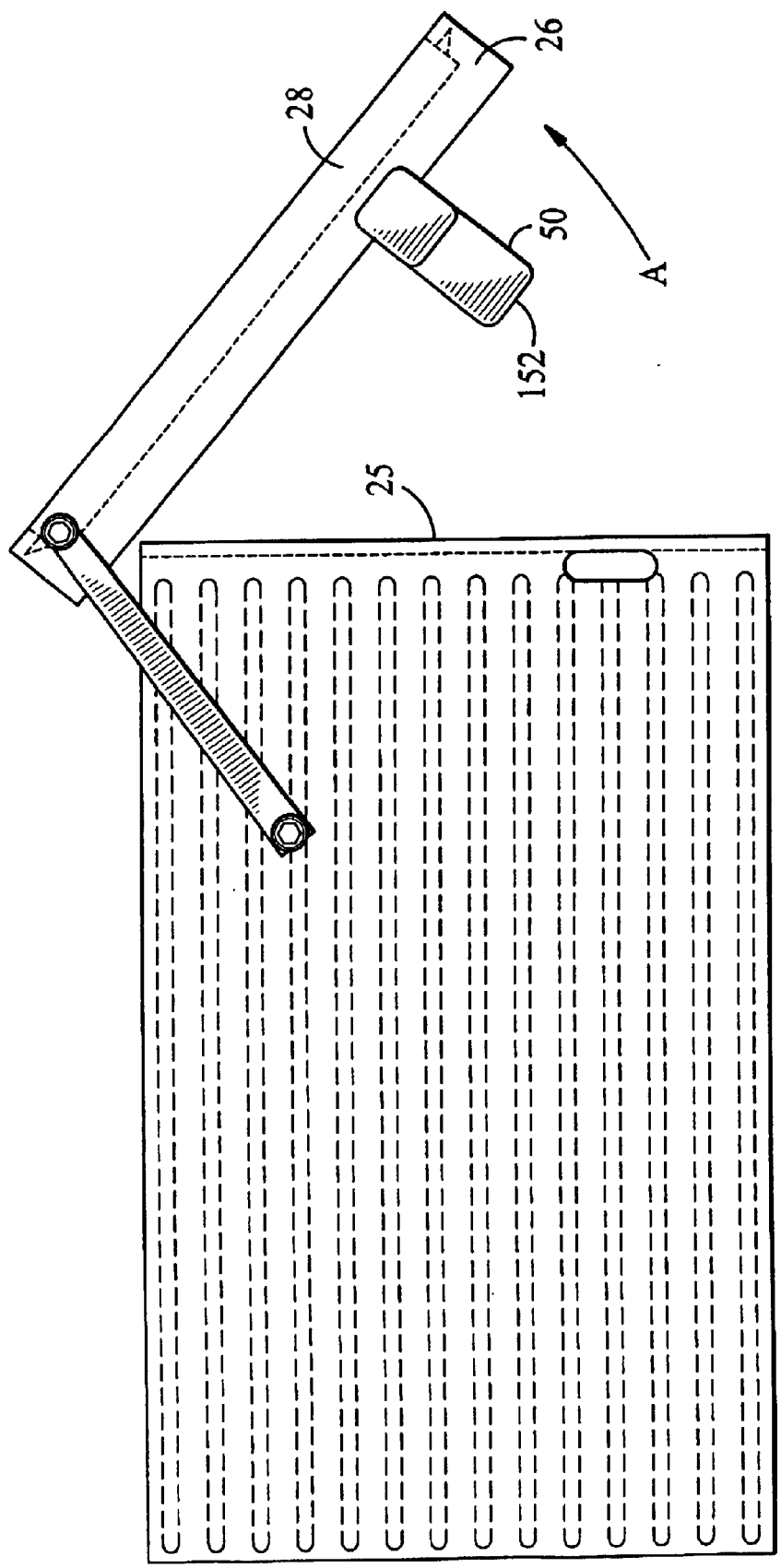

Referring to FIG. 5, latch 50 and latch 52 (not shown) are manually opened to allow frame 26 and inner door 28 to be raised. To open latch 50, hook portion 152 of latch 50 is released by hand from latch receptacle 54 of latch 50. Frame 26 is then free to move upward and away from front side 25 of pod body 12 in the direction of arrow A.

Figure 6:
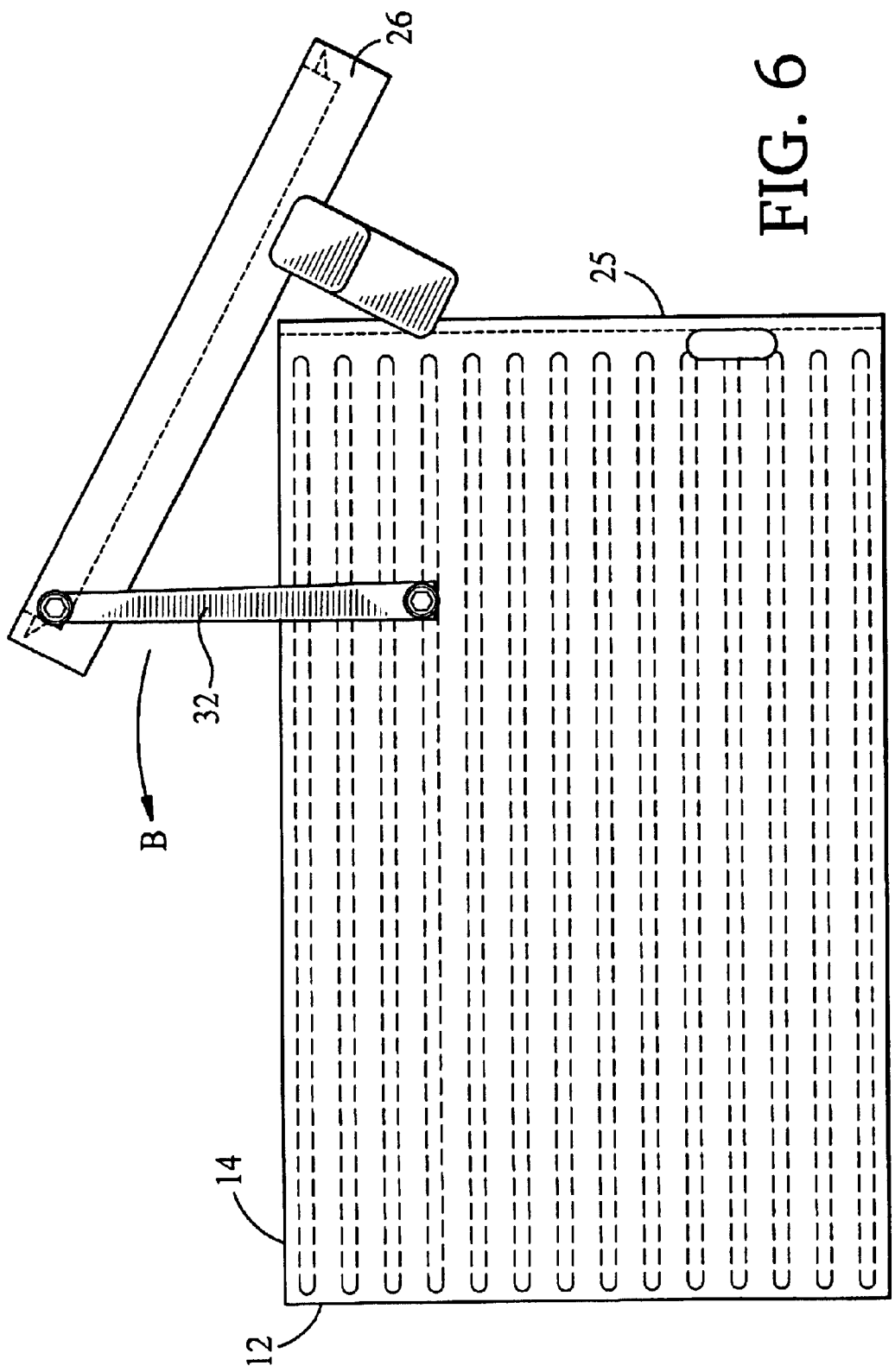

Referring to FIG. 6, frame 26 is lifted further away from front side 25 and further toward top side 14 of pod body 12. Double hinge 32 moves in a counterclockwise direction, as indicated by arrow B, as frame 26 is lifted away from front side 25. Double hinge 32 enables frame 26 to be moved from a closed position to an open position. Double hinge 32 provides a full range of motion for frame 26.

Figure 7:
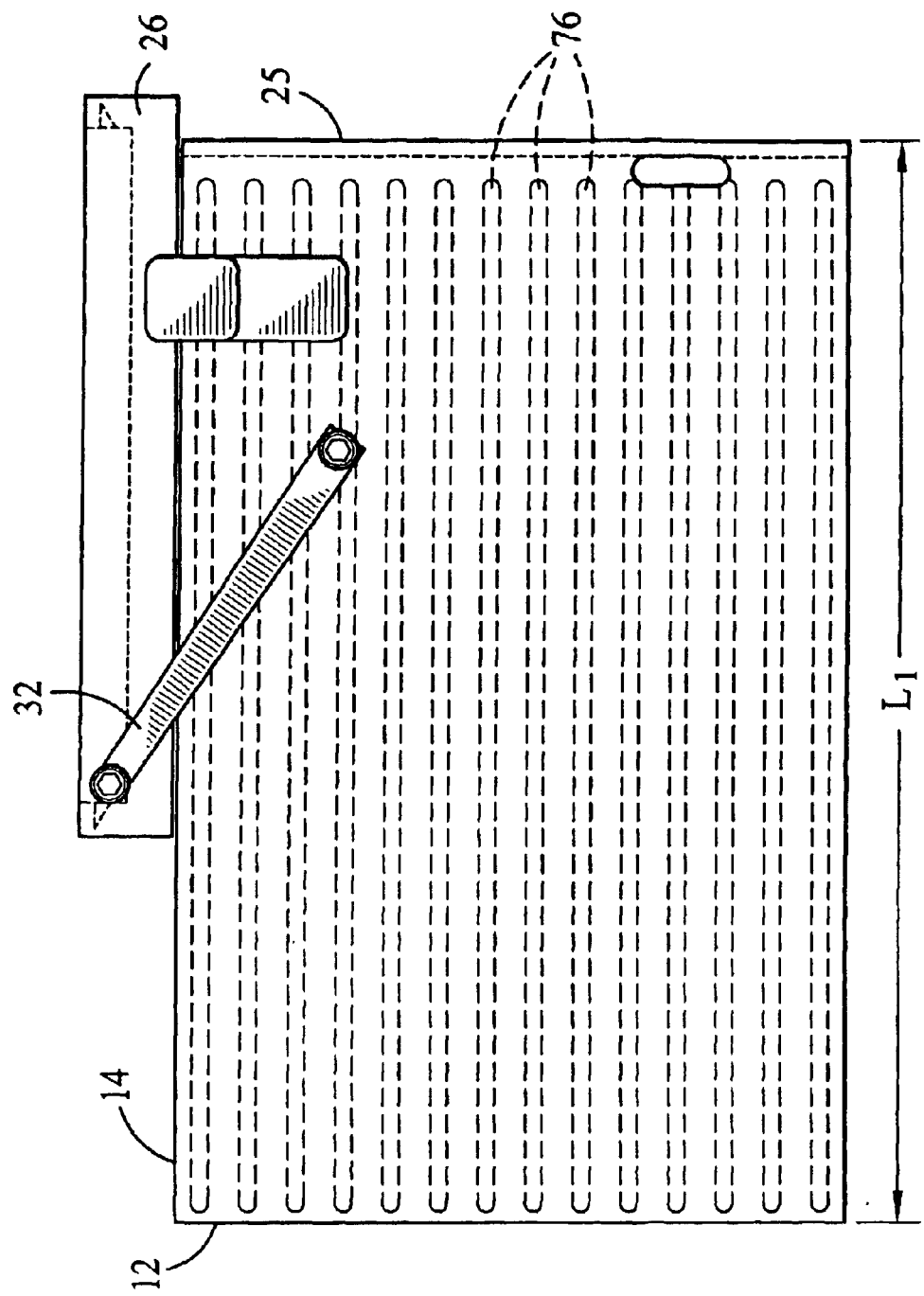

Referring to FIG. 7, in its fully open position, frame 26 rests in a flat position on top side 14 of pod body 12. Here, pod front side 25 is open, and wafers (not shown) can be placed on—or removed from—shelves 76. Shelves 76 have a length $L_1$ of 30.5 cm.

In use, pod front side 25 can be opened in one of two ways. Referring to FIGS. 1A, 2, and 3, first and second keyed locking mechanisms 80, 82 can be moved to their respective unlocked positions by a key (not shown) inserted into keyholes 86, 83 and turned to unlock bolts 66, 68, 70, 72, i.e. retract them from frame 26. Inner door 28 can then be pulled away from pod body 12 and removed by a tool door (not shown). A slightly positive pressure is provided at the loading station to the tool, and thus any wafers inside pod body 12 are exposed to the clean atmosphere of the tool. The DIDFOUP can therefore be used with currently available FOUP stations for loading wafers into processing tools.

Alternatively, referring to FIGS. 1A, 1B, and 4–7, latches 50, 52 can be opened manually, allowing frame 26 to be lifted away from pod front side 25 and onto pod body top side 14. Providing access to pod front side 25 manually is desirable when, for example, the DIDFOUP is used with a tool that does not have a FOUP interface. Pod front side 25 can also be opened manually if there is a need to access wafers inside pod body 12 without a machine, such as in the case of wafer recovery.

Wafers can be transferred from a thirteen-slot DIDFOUP to a conventional twenty-five slot FOUP by use of a wafer handling tool, such as a lot splitter, for example the SPP300mm_F01, manufactured by RECIF, based in Aussone, France.

The invention is not limited to the specific embodiments described above. For example, shelves for supporting wafers can be formed independently of pod sides and inserted into the pod body. The shelves can be made of a material different from that of the pod body.

Other embodiments not described herein are also within the scope of the following claims.

What is claimed is:

1. An apparatus for holding a substrate, comprising:

a shelf capable of holding the substrate;

a body which encloses the shelf, the body having an open side;

an outer door frame pivotally coupled to the body and defining an opening; and an inner door which fits into the opening, the inner door being in one of a locked configuration in which the inner door is in the opening but not removable from the outer door frame, and an unlocked configuration in which the inner door is in the opening but the inner door is disengaged from the outer door frame allowing the inner door to be fully removed from the outer door frame;

wherein the open side is substantially covered by the inner door and by the outer door frame when the inner door and outer door frame are in closed positions.

2. The apparatus of claim 1, further comprising:

a double hinge for pivotally coupling the outer door frame to the body.

3. The apparatus of claim 2, wherein the double hinge is pivotally secured at a first end to the body and at a second end to the outer door frame.

4. The apparatus of claim 1, further comprising:

a bolt movably attached to the inner door;

wherein in the locked configuration the bolt extends into the frame and in the unlocked configuration the bolt retracts from the frame.

5. The apparatus of claim 4, further comprising:

a keyed locking mechanism positioned on the inner door, the keyed locking mechanism having a locked position and an unlocked position, wherein the bolt extends into the door frame when the keyed locking mechanism is in its locked configuration and the bolt retracts from the door frame when the keyed locking mechanism is in the unlocked configuration.

6. The apparatus of claim 5, wherein the keyed locking mechanism comprises a keyhole which receives a key and a locking rod, turning the key in the keyhole moves the locking rod, and the locking rod moves the bolt between locked and unlocked positions.

7. The apparatus of claim 1, wherein the shelf comprises a ridge on an inner surface of the body.

8. The apparatus of claim 1, wherein the outer door frame rests on a top side of the body in a fully open position of the outer door frame.

9. The apparatus of claim 1, further comprising:

a latch attached to the body when latching the outer door frame when the outer door frame is in a closed position.

10. An apparatus for holding a substrate, comprising:

a container which holds the substrate, the container having an open side;

a frame pivotally attached to the container, the frame defining an opening and having a closed position in which the frame is positioned against the open side; and an inner door which fits into the opening, the inner door being in one of a locked configuration in which the inner door is secured inside the opening not removable from the opening, and an unlocked configuration in which the inner door is in the opening but the inner door is disengaged from the frame allowing the inner door to be fully removed from the frame;

wherein the frame and the inner door substantially cover the open side of the container when the frame and the inner door are in closed positions.

11. The apparatus of claim 10, wherein the inner door comprises a bolt for securing the inner door in the frame.

12. The apparatus of claim 11, further comprising:

a keyed locking mechanism mounted on the inner door;

wherein the keyed locking mechanism controls the position of the bolt.

13. The apparatus of claim 10, further comprising:

a double hinge attached at a first end to the frame and at a second end the container.

14. An apparatus comprising:

a box-shaped body having an open side;

an outer frame pivotally coupled to the body and defining an opening, the outer frame having a closed position in which the outer frame is flush against the open side; and an inner door sized to fit the opening, the inner door being in one of a locked configuration in which the inner door is in the opening but not removable from the outer frame, and an unlocked configuration in which the inner door is in the opening but the inner door is disengaged from the outer frame allowing the inner door to be fully removed from the outer frame.

15. The apparatus of claim 14, further comprising:

a bolt attached to the inner door;

wherein the bolt secures the inner door inside the frame opening to the frame when the inner door is in the locked configuration.

* * * * *